US005086308A

United States Patent [19]

Takahashi et al.

[11] Patent Number: 5,086,308

[45] Date of Patent: Feb. 4, 1992

[54] PIEZOELECTRIC INK JET PRINT HEAD INCLUDING COMMON LAMINAR PIEZOELECTRIC ELEMENT FOR TWO OR MORE INK JETTING DEVICES

[75] Inventors: Yoshikazu Takahashi, Kasugai; Masahiko Suzuki, Nagoya; Makoto Takeuchi, Okazaki, all of Japan

[73] Assignee: Brother Kogyo Kabushiki Kaisha, Aichi, Japan

[21] Appl. No.: 552,537

[22] Filed: Jul. 16, 1990

[30] Foreign Application Priority Data

Jul. 19, 1989 [JP] Japan .................................. 1-186232

[51] Int. Cl.[5] ........................ B41J 2/045; H01L 41/08

[52] U.S. Cl. .................................. 346/140 R; 310/333

[58] Field of Search .................... 346/140 PD, 140 R; 310/328, 333, 365, 357; 219/504; 29/25.35

[56] References Cited

U.S. PATENT DOCUMENTS

| | | | |
|---|---|---|---|
| 4,115,789 | 9/1978 | Fischbeck | 346/140 R |
| 4,177,375 | 12/1979 | Meixner | 219/504 |
| 4,584,590 | 4/1986 | Fischbeck et al. | 346/140 R |
| 4,759,107 | 7/1988 | Ogawa et al. | 310/365 |
| 4,812,698 | 4/1989 | Chida et al. | 310/328 |
| 4,825,227 | 4/1989 | Fischbeck et al. | 346/140 R |
| 4,879,568 | 11/1989 | Bartky et al. | 346/140 R |
| 4,887,100 | 12/1989 | Michaelis et al. | 346/140 R |

*Primary Examiner*—Benjamin R. Fuller
*Assistant Examiner*—Alrick Bobb
*Attorney, Agent, or Firm*—Oliff & Berridge

[57] ABSTRACT

A piezoelectric ink jet print head including a common laminar piezoelectric element disposed for activating two or mor ink jetting devices each of which has an ink chamber for ejecting a droplet of ink. The laminar piezoelectric element consists of a plurality of piezoelectric ceramic layers and a plurality of electrode layers which are alternately laminated on each other. Each piezoelectric ceramic layer is polarized in a polarizing direction perpendicular to the direction of lamination of the piezoelectric ceramic and electrode layers. A voltage is applied selectively to the electrode layers for displacing at least one of the piezoelectric ceramic layers in the polarizing direction, so as to change the volume of the ink chamber of a selected one of the ink jetting devices. The electrode layers is formed of a thermistor which has a Curie point lower than that of the piezoelectric ceramic layers and which has a positive temperature coefficient of resistance so that the thermistor is an electrically insulating material at a temperature above the Curie point thereof.

6 Claims, 2 Drawing Sheets

PIEZOELECTRIC INK JET PRINT HEAD INCLUDING COMMON LAMINAR PIEZOELECTRIC ELEMENT FOR TWO OR MORE INK JETTING DEVICES

BACKGROUND OF THE INVENTION

1. Field of the Invention

The present invention relates generally to a piezoelectric ink jet print head, and more particularly to an ink jet print head using a piezoelectric transducer element of a laminar structure.

2. Discussion of the Prior Art

A print head utilizing ink jetting devices driven by a piezoelectric actuator or transducer has been recently proposed. Each ink jetting device has an ink chamber provided with an ejecting nozzle. In operation, the volume of the ink chamber is changed by energizing and de-energizing the piezoelectric transducer, so that a droplet of ink is emerged through the ejecting nozzle when the volume of the ink chamber is reduced, while an ink material is supplied into the ink chamber when the volume of the ink chamber is increased. A multiplicity of such ink jetting devices are arranged such that the ejecting nozzles are spaced from each other, and the droplets of ink are ejected from the nozzles of the ink jetting devices selectively activated by the appropriate piezoelectric transducers, so that the ink droplets form characters or other desired images on a recording medium placed adjacent to the print head. This type of non-impact print head activated by the piezoelectric transducers has reduced operating noises than an impact print head, and is more economical to operate than a thermal print head.

However, the piezoelectric ink jet print head uses a piezoelectric transducer for each of the ink jetting devices, and the multiple ink jetting devices must be disposed in close proximity to each other with a high density per unit length of printing, in order to assure high resolving power or high degree of accuracy of reproduction of original images. Accordingly, the ink jet print head tends to be complicated in construction and manufacturing process, resulting in an increase in the cost of manufacture.

On the other hand, the reduction in the size of the piezoelectric transducer is limited due to the limitations in the manufacture. Therefore, the reduction in the size of the ink jetting devices is practically limited, and the conventional piezoelectric ink jet print head cannot be sufficiently improved in the resolution of image reproduction.

SUMMARY OF THE INVENTION

It is accordingly an object of the present invention to provide a piezoelectric ink jet print head which is comparatively simple in construction and economical to manufacture and which has a comparatively high degree of resolution.

A second object of the present invention is to provide a process suitable for producing such a piezoelectric ink jet print head as indicated above.

The first object may be achieved according to one aspect of the present invention, which provides a piezoelectric ink jet print head including a plurality of ink jetting devices each having an ink chamber whose volume is changed by a piezoelectric transducer to eject a droplet of ink, wherein the improvement comprises (a) a piezoelectric transducer consisting of a common laminar piezoelectric element disposed for activating a plurality of ink jetting devices, the laminar piezoelectric element consisting of a plurality of piezoelectric ceramic layers and a plurality of electrode layers which are alternately laminated on each other, each of the piezoelectric ceramic layers being polarized in a polarizing direction perpendicular to a direction in which the piezoelectric ceramic layers and the electrode layers are laminated; and (b) voltage applying means for applying a voltage selectively to the electrode layers for displacing at least one of the piezoelectric ceramic layers in the polarizing direction, due to a piezoelectric shear effect, so as to change a volume of the ink chamber of a selected one of the ink jetting devices which corresponds to the above-indicated at least one of the piezoelectric ceramic layers. The electrode layers are formed of a thermistor which has a Curie point lower than that of the piezoelectric ceramic layers and which has a positive temperature coefficient of resistance so that the thermistor is an electrically insulating material at a temperature above the Curie point thereof.

In the piezoelectric ink jet print head of the present invention constructed as described above, the laminar piezoelectric element is provided for the two or more ink jetting devices, so that the volume of the ink chamber of each ink jetting device is changed to eject a droplet of ink from the ink chamber, due to deformation or displacement of the appropriate piezoelectric ceramic layer or layers due to the piezoelectric shear effect caused by an electric field produced upon application of a voltage to the appropriate electrode layers. The term "piezoelectric shear effect" is interpreted to mean displacement or deformation of each energized piezoelectric ceramic layer due to shearing strains which occur in two different portions of the piezoelectric ceramic layer, in the opposite directions parallel or perpendicular to the direction of the applied electric field. The two different portions are opposed to each other in the direction of polarization of the piezoelectric ceramic layer.

Since the single laminar piezoelectric element is used as the piezoelectric transducer for the two or more ink jetting devices, the print head can be considerably simplified in construction and produced at a relatively reduced cost due to the reduced number of manufacturing steps.

Further, the laminar piezoelectric element may be relatively easily manufactured and reduced in size, owing to the use of a thermistor for the electrode layers which has a lower Curie point than the piezoelectric ceramic layers and has a positive temperature dependence of electrical resistance so that the electrical resistance of the thermistor suddenly increases with an increase in the temperature above the Curie point. The use of the thermistor for the electrode layers makes it possible to produce the piezoelectric element in the following manner. Initially, the green sheets of the thermistor and piezoelectric ceramic material are alternately superposed one on another, to obtain an unfired laminar structure. The layers of the obtained unfired laminar structure are co-fired into a fired laminar structure. Then, the fired laminar structure is subjected to a polarization treatment by applying an electric field thereto in the direction perpendicular to the direction of lamination of the green sheets, at a temperature which is higher than the Curie point of the thermistor and lower than the Curie point of the piezoelectric ceramic material, namely, at a temperature at which the thermistor is an electrically insulating material while the piezoelectric ceramic material still exhibits ferroelectricity. With this polarization treatment, the fired structure of the laminar piezoelectric element provides a piezoelectric shear effect upon application of a voltage thereto through the electrode layers.

The laminar piezoelectric element consisting of the electrode and piezoelectric ceramic layers and subjected to the polarization treatment as described above requires a reduced number of steps and has accordingly improved production efficiency, as compared with a conventional piezoelectric element which is prepared by first polarizing piezoelectric ceramic sheets in the direction perpendicular to the direction of thickness, then forming electrode layers on the surfaces of each polarized piezoelectric ceramic sheet which are parallel to the direction of polarization, and finally bonding the piezoelectric ceramic sheets to each other with an adhesive at the electrode layers. The manufacturing process of the laminar piezoelectric element of the present piezoelectric ink jet print head further permits the piezoelectric ceramic layers and electrode layers to have a relatively small thickness. That is, the piezoelectrically displaced portion of each ink chamber of the ink jetting device can be made with a reduced thickness or cross sectional area, whereby the ink jetting device can be accordingly small-sized. This leads to improved resolution of image reproduction by the ink jet print head.

It will be understood that while the thermistor of the electrode layers is electrically insulating at the polarization treatment temperature above the Curie point, it is electrically conductive and able to function as the electrodes at the operating temperature of the print head, which is normally well below the Curie point.

As described above, the present piezoelectric ink jet print head is economical to manufacture, and simplified in construction with the ink jetting devices significantly small-sized so as to provide an improvement in the resolution of images to be reproduced by the print head.

The piezoelectric ceramic layers are preferably formed of a ferroelectric material such as lead titanate-zirconate (PZT) or lead titanate (PT), while the thermistor of the electrode layers preferably consists principally of barium titanate.

The common laminar piezoelectric element may partially define the ink chambers of the ink jetting devices, and may be disposed so as to activate a pair of ink jetting devices, for example. The two piezoelectric ceramic layers may be provided for each of the ink chambers of the ink jetting devices, so that a droplet of ink is ejected from each ink chamber when the appropriate two ceramic layers are displaced upon application of a voltage thereto by the voltage applying means.

The second object may be attained according to another aspect of the present invention, which provides a process of producing a piezoelectric ink jet print head having a plurality of ink jetting devices each having an ink chamber whose volume is changed by a piezoelectric transducer to eject a droplet of an ink, comprising the steps of: (a) preparing a laminar ceramic slab consisting of a plurality of piezoelectric ceramic layers and a plurality of electrode layers which are alternately laminated such that each of the piezoelectric ceramic layers is disposed between adjacent two layers of the electrode layers, the electrode layers being formed of a thermistor which has a Curie point lower than that of the piezoelectric ceramic layer and which has a positive temperature coefficient of electrical resistance so that the thermistor is an electrically insulating material at a temperature above the Curie point thereof; (b) subjecting the laminar ceramic slab to a polarization treatment at a polarization temperature between the Curie points of the piezoelectric ceramic layers and the electrode layers, to polarize the piezoelectric ceramic layers in a polarizing direction perpendicular to a direction in which the piezoelectric ceramic layers and the electrode layers are laminated, the polarized laminar ceramic slab serving as a laminar piezoelectric element; and (c) using the laminar piezoelectric element as a common piezoelectric transducer for activating a plurality of ink jetting devices each having an ink chamber whose volume is changed by displacement of the piezoelectric transducer upon application of a voltage to at least one of the plurality of piezoelectric ceramic layers via the electrode layers.

BRIEF DESCRIPTION OF THE DRAWINGS

The above and other objects, features and advantages of the present invention will become more apparent by reading the following detailed description of a presently preferred embodiment of the invention, when considered in connection with the accompanying drawings, in which.

DETAILED DESCRIPTION OF THE PREFERRED EMBODIMENT

Figure 1:
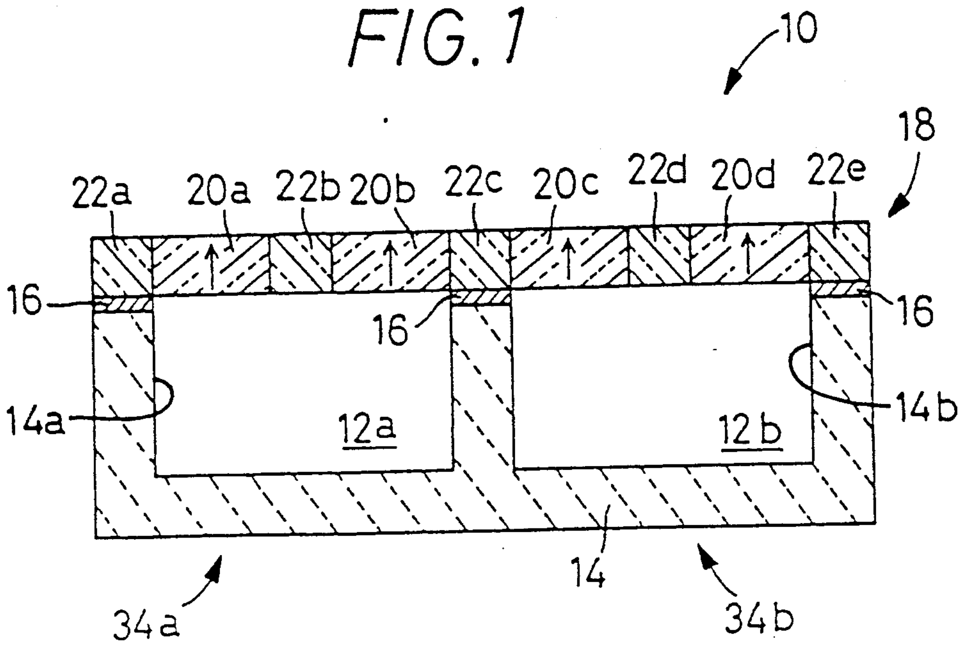
FIG. 1 is an elevational view in cross section of a piezoelectric transducer unit which constitutes a part of a piezoelectric ink jet print head constructed according to one embodiment of the present invention.

Referring first to FIG. 1, reference numeral 10 denotes one of a multiplicity of piezoelectric transducer units used on a piezoelectric ink jet print head for a printer. The piezoelectric transducer unit 10 includes a rectangular body 14 having two rectangular recesses 14*a*, 14*b* formed therein. These recesses 14*a*, 14*b* are open in the top surface of the body 14, and the openings are closed by a laminar piezoelectric element 18 which is bonded to the body 14 by means of adhesive layers 16. The rectangular body 14 and the laminar piezoelectric element 18 cooperate with each other to define two ink chambers 12*a* and 12*b* to be filled with an ink used for printing. As described below, the piezoelectric transducer unit 10 provides two ink jetting devices having the respective ink chambers 12*a*, 12*b*.

The laminar piezoelectric element 18 consists of four piezoelectric ceramic layers 20*a*, 20*b*, 20*c*, 20*d* and five electrode layers 22*a*, 22*b*, 22*c*, 22*d* and 22*e* which are alternately laminated or superposed on each other in a direction perpendicular to the direction of thickness of the element 18. The piezoelectric ceramic layers 20 exhibit the piezoelectric effect well known in the art, and each of these piezoelectric ceramic layers 20 is sandwiched by the adjacent two electrode layers 22. The piezoelectric ceramic layers 20*a* and 20*b* and the electrode layer 22*b* partially define the ink chamber 12*a*, while the piezoelectric ceramic layers 20*c* and 20*d* and the electrode layer 22*d* partially define the ink chamber 12*b*. The laminar piezoelectric element 18 is bonded to the rectangular body 14 at the two outermost electrode layers 22*a* and 22*e* and the central electrode layer 22*c*. The two ink chambers 12*a*, 12*b* communicate with a suitable ink reservoir.

The piezoelectric ceramic layers 20 are formed of a piezoelectric ceramic, preferably, lead titanate-zirconate (PZT), and are polarized in the direction perpendicular to the direction in which the layers 20 and 22 are laminated, i.e., polarized in the vertical direction as indicated by arrows in FIG. 1. On the other hand, the electrode layers 22 are formed of a thermistor, preferably, barium titanate, which has a Curie point lower than that of the piezoelectric ceramic of the layers 20. The thermistor has a positive temperature dependence of electrical resistance, and the electrical resistance suddenly increases with an increase in the temperature above the Curie point. Namely, the electrode layers 22 become an electrically insulating material at a temperature above the Curie point.

Figure 3:
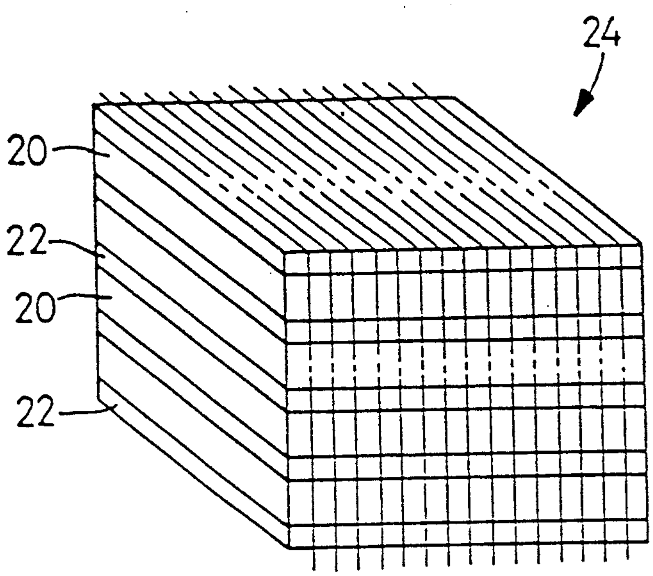
FIG. 3 is a perspective view of a fired laminar structure consisting of superposed piezoelectric ceramic sheets and thermistor sheets.
Figure 4:
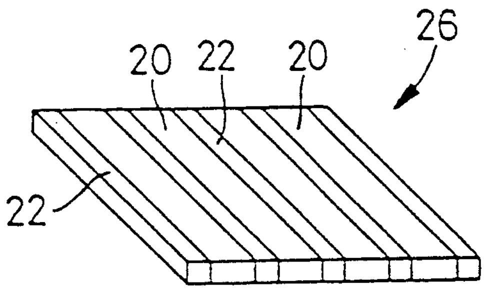
FIG. 4 is a perspective view showing a laminar ceramic slab which is obtained by slicing the fired laminar structure of FIG. 3.

The piezoelectric element 18 is produced in the following manner:

Initially, green sheets of lead titanate-zirconate for the piezoelectric ceramic layers 20 and barium titanate for the electrode layers 22 are alternately superposed on each other by a suitable method such as a doctor blade method, such that the formed green sheets for the layers 20, 22 have suitable thicknesses. The thus prepared unfired laminar structure is compacted under pressure and at an elevated temperature, and trimmed to a desired shape having desired dimensions. The green sheets of the obtained laminar structure are co-fired into a fired laminar structure 24 which consists of the alternately superposed piezoelectric ceramic layers 20 and electrode layers 22, as illustrated in FIG. 3. The thus prepared fired laminar structure 24 is sliced in parallel planes indicated by one-dot chain lines in FIG. 3, so as to provide a plurality of laminar ceramic slabs, one of which is shown at 26 in FIG. 4. The laminar ceramic slab 26 has substantially the same thickness as the piezoelectric element 18.

Figure 5:
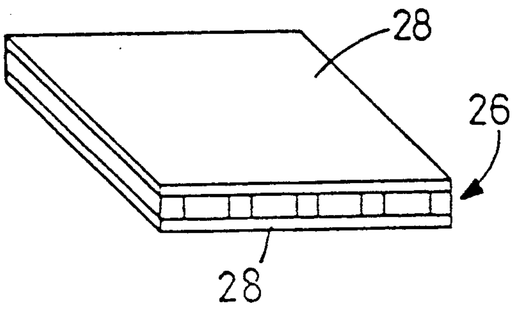
FIG. 5 is a perspective view showing the ceramic slab of FIG. 4 having a pair of polarizing electrodes formed thereon for effecting a polarization treatment to prepare a laminar piezoelectric element from the polarized ceramic slab.

While the laminar ceramic slab 26 has the same dimensions and shape as the piezoelectric element 18 to be prepared, the piezoelectric ceramic layers 20 are polarized in different random directions. That is, the directions of the spontaneous polarization of the layers 20 obtained by the mere sintering are not consistent. To polarize the piezoelectric ceramic layers 20 in the same direction, the laminar ceramic slab 26 is subjected to a polarization treatment. For this purpose, the ceramic slab 26 is provided with a pair of polarizing electrodes 28, 28 formed on the opposite major surfaces thereof, as indicated in FIG. 5. The ceramic slab 26 is then immersed in a bath of an electrically insulating oil such as silicone oil, and a voltage is applied between the electrodes 28, with the oil bath maintained at a temperature which is higher than the Curie point of the electrode layers 22 and lower than the Curie point of the piezoelectric ceramic layers 20. For instance, the oil bath temperature is maintained at a temperature in the neighborhood of 130° C. At this polarization temperature, the electrode layers 22 formed of barium titanate is an electrically insulating material, while the piezoelectric ceramic layers 20 formed of lead titanate-zirconate is still ferroelectric. Accordingly, the piezoelectric ceramic layers 20 are polarized in the direction of thickness of the slab 26, i.e., in the direction perpendicular to the direction of lamination of the layers 20, 22, with an electric field applied in the direction of thickness of the slab 26. The piezoelectric element 18 is eventually prepared by removing the polarizing electrodes 28 from the ceramic slab 26 which has been subjected to the polarization treatment.

The multiplicity of piezoelectric transducer units 10 each using the thus prepared piezoelectric element 18 to partially define the two ink chambers 12*a*, 12*b* are arranged in close proximity to each other in a straight row, so as to provide an ink jet print head, in which the ink chambers 12*a*, 12*b* communicate with an ink reservoir through respective suction valves.

Figure 2:
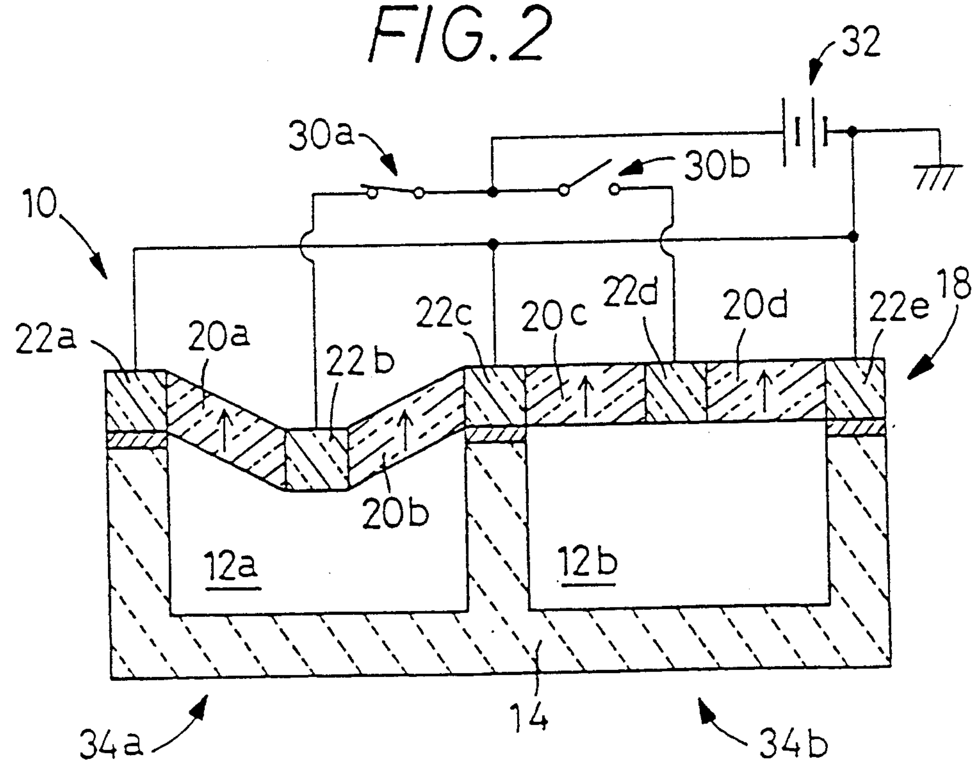
FIG. 2 is an elevational view in cross section of the piezoelectric transducer unit of FIG. 1 in operation, with a voltage applied thereto by voltage applying means.

Further, each piezoelectric transducer unit 10 is electrically connected to a power source 32 through switches 30*a*, 30*b*, as indicated in FIG. 2. Described more specifically, the electrode layers 22*b* and 22*d* which partially define the ink chambers 12*a*, 12*b*, respectively, are connected to the positive terminal of the power source 32 through the switch 30*a*, while the electrode layers 22*a*, 22*c* and 22*e* at which the element 18 is secured to the body 14 are connected to the negative terminal of the power source 32 through the switch 30*b*. The two switches 30*a*, 30*b* are connected to a suitable control device of the printer, for applying a drive voltage to the piezoelectric ceramic layers 20*a*, 20*b* of the ink chamber 12*a*, or piezoelectric ceramic layers 20*c*, 20*d* of the ink chamber 12*b*. In this connection, it is noted that the normal operating temperature of the ink jet print head is well below the Curie point of the electrode layers 22, so that the electrode layers 22 serve as electrically conductive electrodes.

If the switch 30*a* is closed, for example, a voltage is applied between the electrodes 22*a* and 22*b*, and between the electrodes 22*b* and 22*c*, whereby a bias electric field is applied between the piezoelectric ceramic layers 20*a* between the electrodes 22*a*, 22*b*, and between the piezoelectric ceramic layer 20*b* between the electrodes 22*b*, 22*c*. As a result, the piezoelectric ceramic layers 20*a*, 20*b* are displaced inwardly of the ink chamber 12*a*, together with the electrode 22*b*, due to the piezoelectric shear effect in which the upper and lower portions of each activated piezoelectric ceramic layer 20*a*, 20*b* are subject to shearing strains in the opposite directions parallel or perpendicular to the direction of the applied bias electric field. Consequently, the volume of the ink chamber 12*a* is reduced so as to eject a droplet of the ink through a nozzle formed with the ink chamber 12*a*. Upon breaking of the switch 30*a* and consequent displacement of the piezoelectric ceramic layers 20*a*, 20*b* together with the electrode 22*b* back to the original position, the ink material is sucked through the suction valve into the ink chamber 12*a* due to an increase in the volume. When the other switch 30*b* is closed, the piezoelectric ceramic layers 20*c*, 20*d* and the electrode layer 22*d* of the other ink chamber 12*b* are displaced to reduce the volume of the ink chamber 12*b*, thereby ejecting a droplet of ink through the nozzle of the chamber 12*b*.

It will be understood from the above description that each piezoelectric transducer unit 10 provides two ink jetting devices 34*a*, 34*b* having the respective ink chambers 12*a*, 12*b*, and that the laminar piezoelectric element 18 is used commonly as a piezoelectric transducer for the two ink jetting devices 34*a*, 34*b*.

Since the single laminar piezoelectric element 18 serves as the common piezoelectric transducer for the two ink jetting devices 34*a*, 34*b*, the piezoelectric transducer units 10, and the ink jet print head including these units 10 can be made considerably simplified in construction, and the process for manufacturing the print head can be accordingly simplified, with a reduced number of process steps. Accordingly, the present ink jet print head is available at a considerably reduced cost.

It is also noted that the laminar piezoelectric element 18 which is prepared by polarizing the laminar slab 26 consisting of the alternately superposed piezoelectric ceramic (lead titanate-zirconate) layers 20 and thermistor electrode layers 22 requires a considerably reduced number of manufacturing steps and has accordingly improved production efficiency, as compared with a conventional piezoelectric element which is prepared by first polarizing piezoelectric ceramic sheets in the direction perpendicular to the direction of thickness, then forming electrode layers on the surfaces of each polarized piezoelectric ceramic sheet which are parallel to the direction of polarization, and finally bonding the piezoelectric ceramic sheets to each other with an adhesive at the electrode layers. In this respect, too, the cost of manufacture of the ink jet print head is significantly lowered.

Further, the manufacturing process of the laminar piezoelectric element 18 as described above permits the piezoelectric ceramic and electrode layers 20, 22 to have a relatively small thickness. That is, the piezoelectrically displaced portion of each ink chamber 12*a*, 12*b* of the ink jetting device 34*a*, 34*b* can be made with a reduced thickness, whereby the ink jetting device can be accordingly small-sized, resulting in an improvement in the resolution of reproduction of a wide variety of images by the ink jet print head. The reduction in the thickness of the piezoelectric ceramic layers 20 provides reduction in the required level of voltage applied to the electrode layers 22.

In the laminar piezoelectric element 18 used in the present embodiment employs a piezoelectric ceramic consisting principally of lead titanate-zirconate (PZT) for the piezoelectric ceramic layers 20 and a ceramic consisting essentially of barium titanate for the electrode layers 22. That is, the firing temperatures and the ratios of shrinkage upon firing of the piezoelectric ceramic layers 20 are more or less similar or close to those of the electrode layers 22. Since the crystal structures of the layers 20, 22 are both perovskite, the fired layers 20, 22 have a sufficiently high bonding strength, as compared with the bonding strength of the conventional counterpart which uses an adhesive agent. Accordingly, the durability of the present laminar piezoelectric element 18 is increased.

While the present invention has been described in its presently preferred embodiment, it is to be understood that the invention is not limited to the details of the illustrated embodiment, but may be embodied otherwise.

For instance, the total number of the piezoelectric ceramic layers 20 and electrode layers 22 may be increased so that the laminar piezoelectric element 18 serves as a common piezoelectric transducer for three or more ink jetting devices, rather than the two ink jetting devices 34*a*, 34*b* of the illustrated embodiment.

The lead titanate-zirconate and barium titanate used for the piezoelectric ceramic layers 20 and electrode layers 22 may be replaced by other piezoelectric ceramic materials such as lead titanate, and other ceramic materials, respectively. Further, suitable additives such as a binder may be added to the materials of these layers 20, 22.

In the illustrated embodiment, the fired laminar structure 24 is sliced into the laminar ceramic slabs 26 each having the same size and dimensions as the piezoelectric elements 18. However, the laminar ceramic slabs 26 may be prepared by firing alternately superposed unfired layers of the materials for the layers 20, 22.

It is to be understood that the present invention may be embodied with various other changes, modifications and improvements, which may occur to those skilled in the art, without departing from the spirit and scope of the present invention defined in the following claims.

What is claimed is:

1. A piezoelectric ink jet print head including a plurality of ink jetting devices each having an ink chamber whose volume is changed by a piezoelectric transducer to eject a droplet of ink, wherein the improvement comprises:

a piezoelectric transducer consisting of a common laminar piezoelectric element disposed for activating a plurality of ink jetting devices, said common laminar piezoelectric element partially defining each said ink chamber of said plurality of ink jetting devices, said laminar piezoelectric element consisting of a plurality of piezoelectric ceramic layers and a plurality of electrode layers which are alternately laminated on each other;

each of said plurality of piezoelectric ceramic layers being polarized in a polarizing direction perpendicular to a direction in which said piezoelectric ceramic layers and said electrode layers are laminated;

voltage applying means for applying a voltage selectively to said plurality of electrode layers for displacing at least one of said plurality of piezoelectric ceramic layers in said polarizing direction, due to a piezoelectric shear effect, so as to change a volume of the ink chamber of a selected one of said plurality of ink jetting devices which corresponds to said at least one of the piezoelectric ceramic layers; and said electrode layers being formed of a thermistor which has a Curie point lower than that of said piezoelectric ceramic layers and which has a positive temperature coefficient of resistance so that said thermistor is an electrically insulating material at a temperature above the Curie point thereof.

2. A piezoelectric ink jet print head according to claim 1, wherein each of said piezoelectric ceramic layers is formed of a ferroelectric material.

3. A piezoelectric ink jet print head according to claim 2, wherein said ferroelectric material consists principally of lead titanate-zirconate or lead titanate.

4. A piezoelectric ink jet print head according to claim 1, wherein said thermistor consists principally of barium titanate.

5. A piezoelectric ink jet print head according to claim 1, wherein said common laminar piezoelectric element is disposed so as to activate a pair of ink jetting devices.

6. A piezoelectric ink jet print head according to claim 1, wherein said at least one of said plurality of piezoelectric ceramic layers which is displaced in said polarizing direction upon application of said voltage by said voltage applying means consists of two piezoelectric ceramic layers which partially defines the ink chamber of said selected one ink jetting device.

* * * * *